(12) United States Patent
Lu (10) Patent No.: US 12,225,714 B2
(45) Date of Patent: Feb. 11, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 411 days.

(21) Appl. No.: 17/661,065

(22) Filed: Apr. 28, 2022

(65) Prior Publication Data

US 2023/0048610 A1 Feb. 16, 2023

(30) Foreign Application Priority Data

Aug. 13, 2021 (CN) .......................... 202110931844.8

(51) Int. Cl.
*H10B 12/00* (2023.01)
(52) U.S. Cl.
CPC ........... *H10B 12/34* (2023.02); *H10B 12/053* (2023.02)

(58) Field of Classification Search
None
See application file for complete search history.

(56) References Cited

U.S. PATENT DOCUMENTS

| | | | |
|---|---|---|---|
| 10,109,738 B2 | 10/2018 | Kim et al. | |
| 11,056,175 B1* | 7/2021 | Ikeda | G11C 11/4023 |
| 2015/0194438 A1* | 7/2015 | Kim | H10B 12/488 |
| | | | 257/324 |

* cited by examiner

*Primary Examiner* — Hsien Ming Lee
(74) *Attorney, Agent, or Firm* — Syncoda LLC; Feng Ma (57) ABSTRACT

Embodiments of the present application relate to the field of semiconductors, and provide a semiconductor structure and a manufacturing method thereof. The semiconductor structure includes: a substrate, including active regions arranged at intervals and an isolation structure located between the active regions; a word line (WL) trench, penetrating through the active region and the isolation structure along a first direction; and a WL, located in the WL trench, wherein on a section in a second direction, a first height difference is formed between the active region and the isolation structure; and the second direction is parallel to the substrate and perpendicular to the first direction.

20 Claims, 8 Drawing Sheets

SEMICONDUCTOR STRUCTURE AND MANUFACTURING METHOD THEREOF

CROSS-REFERENCE TO RELATED APPLICATIONS

This application claims the priority of Chinese Patent Application No. 202110931844.8 submitted to the Chinese Intellectual Property Office on Aug. 13, 2021, the disclosure of which is incorporated herein in its entirety by reference.

TECHNICAL FIELD

Embodiments of the present application relate to the technical field of semiconductors, and in particular to a semiconductor structure and a manufacturing method thereof.

BACKGROUND

The memory is widely applied to various electronic products as a device for storing information in modern information technology. The memory can be classified into an internal memory and an external memory according to whether it can be directly read by a central processor. The internal memory can further be classified into a dynamic random access memory (DRAM) and a static random access memory (SRAM), etc.

A memory usually includes a capacitor and a transistor connected to the capacitor. An active region, a drain region and a gate are formed in the transistor. The gate is configured to control the flow of current between the active region and the drain region, and is connected to a word line (WL).

SUMMARY

Embodiments of the present application provide a semiconductor structure and a manufacturing method thereof.

According to an aspect, an embodiment of the present application provides a semiconductor structure, including: a substrate, including active regions arranged at intervals and an isolation structure located between the active regions; a word line trench, penetrating through the active region and the isolation structure along a first direction; and a word line, located in the word line trench, wherein on a section parallel to a second direction, a first height difference is formed between the active region and the isolation structure; and the second direction is parallel to the substrate and perpendicular to the first direction.

According to another aspect, an embodiment of the present application further provides a method of manufacturing a semiconductor structure, including: providing a substrate, the substrate including a plurality of active regions arranged at intervals and an isolation structure for isolating adjacent active region; patterning the active region and the isolation structure, and forming a word line trench, the word line trench extending along a first direction, and a sidewall of the word line trench exposing the active region and the isolation structure; performing corner rounding at least once on the active region and the isolation structure exposed by the sidewall of the word line trench, such that a first height difference is formed in the second direction between the active region and the isolation structure exposed by the sidewall of the word line trench; and forming, upon completion of the corner rounding, word line filling the word line trench.

BRIEF DESCRIPTION OF THE DRAWINGS

One or more embodiments are exemplified by corresponding drawings, and these exemplified descriptions do not constitute a limitation on the embodiments. The drawings are not limited by scale unless otherwise specified.

DETAILED DESCRIPTION

Embodiments of the present application provide a semiconductor structure and a manufacturing method thereof. In a direction perpendicular to an extension direction of the WLs, a first height difference is formed between active regions and isolation structures contacting the WLs, so the semiconductor structure increases the contact area between the active regions and the WLs, thereby helping the WLs better control the conductivity of channels in the active regions.

The embodiments of the present application are described in detail below with reference to the drawings. Those of ordinary skill in the art should understand that many technical details are proposed in each embodiment of the present application to help the reader better understand the present application. However, even without these technical details and various changes and modifications made based on the following embodiments, the technical solutions claimed in the present application may still be realized.

Figure 1:
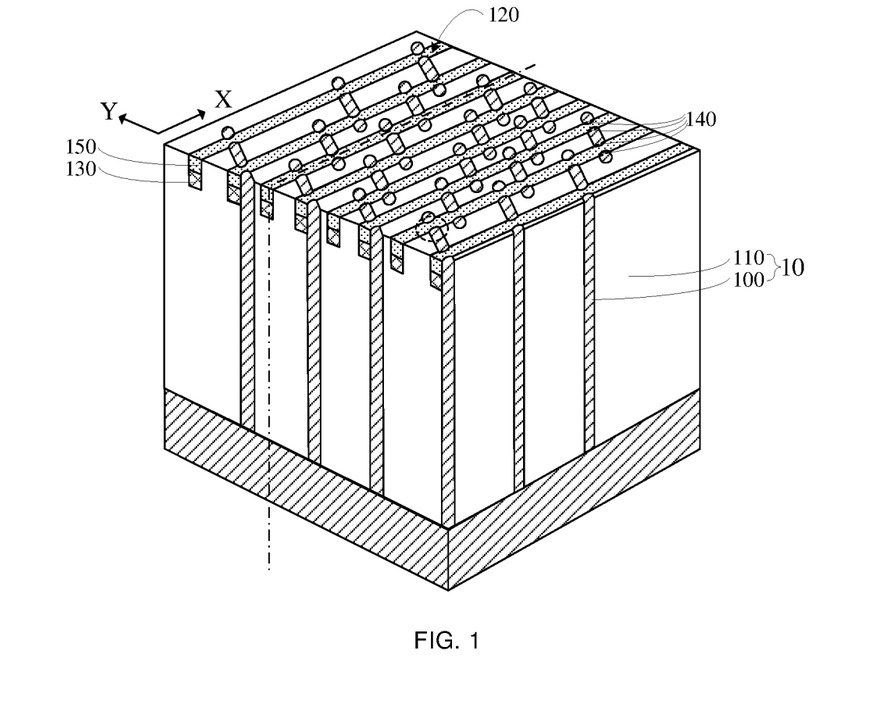
FIG. 1 illustrates a semiconductor structure according to an embodiment of the present application.
Figure 2:
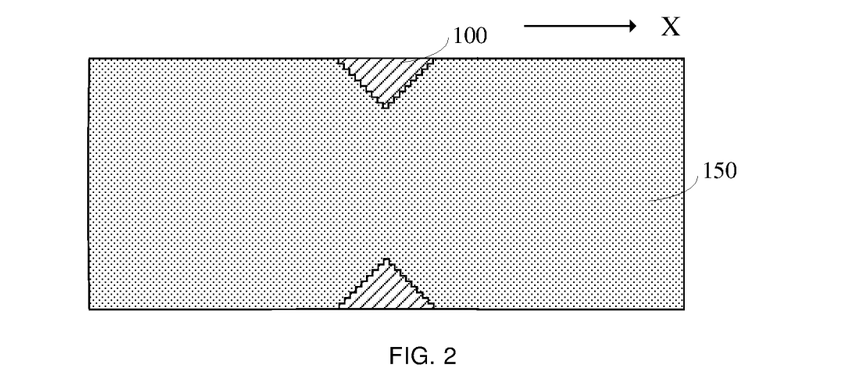
FIG. 2 is a partially enlarged schematic view of a semiconductor structure according to an embodiment of the present application.
Figure 3:
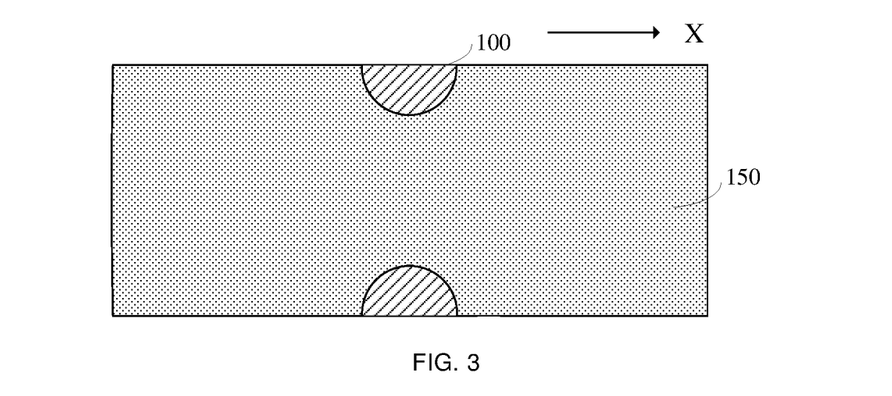
FIG. 3 is a partially enlarged schematic view of another semiconductor structure according to an embodiment of the present application.
Figure 4:
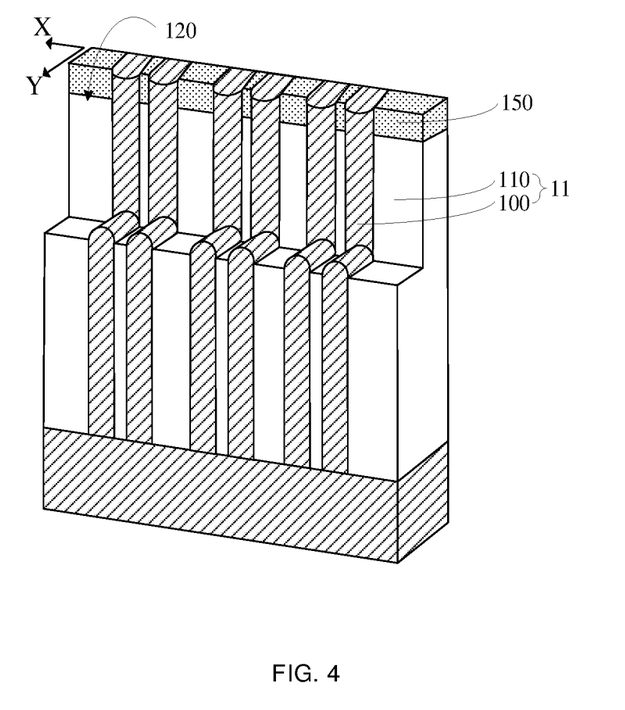
FIG. 4 is a sectional view of a semiconductor structure according to an embodiment of the present application.

FIG. 1 is a schematic structural view of a semiconductor structure according to the present application. FIG. 2 is a partially enlarged view along a circular dotted box in FIG. 1. FIG. 3 is another partially enlarged view along a circular dotted box in FIG. 1. FIG. 4 is a sectional view along an AA1 direction in FIG. 1.

Referring to FIG. 1 to FIG. 4, the semiconductor structure includes: a substrate 10, including active regions 100 arranged at intervals and isolation structures 110 located between the active regions 100; WL trenches 120, penetrating through the active regions 100 and the isolation structures 110 along a first direction X; and WLs 130, located in the WL trenches 120. On a section in a second direction Y, a first height difference is formed between the active regions 100 and the isolation structures 110, and the second direction Y is parallel to the substrate 10 and perpendicular to the first direction X.

The semiconductor structure includes the WL trenches 120 penetrating through the active regions 100 and the isolation structures 110 along the first direction X and the WLs 130 filling the WL trenches 120. In a direction parallel to the second direction Y, the first height difference is formed between active regions 100 and isolation structures 110 contacting the WLs 130. Therefore, the semiconductor structure increases the contact area between the active regions 100 and the WLs 130, thereby helping the WLs 130 better control the conductivity of channels in the active regions 100.

In some embodiments, the active regions 100 may be made of silicon, germanium or gallium arsenide. It will be understood that the active regions 100 may be made of a corresponding material as required. Regions of the active regions 100 close to the WLs 130 are provided with channels. When the semiconductor structure is an N-channel metal oxide semiconductor (NMOS) transistor, N-type ions are doped in the channels. When the semiconductor structure is a P-channel metal oxide semiconductor (PMOS) transistor, P-type ions are doped in the channels.

The isolation structures 110 may be made of silicon oxide, silicon nitride or silicon oxynitride. It will be understood that the isolation structures 110 may be made of a corresponding material as required.

In some embodiments, the active regions 100 each includes a protrusion 140. Aside of the protrusion 140 contacts each of the WLs 130. Along the second direction Y, a width of the WL 130 which contacting the protrusion 140 is smaller than a width of the WL 130 which contacting each of the isolation structures 110. The active regions 100 each having the protrusion 140 contacts the WLs 130, such that the contact area between the active regions 100 and the WLs 130 is increased, and the WLs 130 better control the conductivity of the channels in the active regions 100.

The protrusion 140 extends toward each of the WLs 130. Interfaces wherein the active regions 100 contact the sidewalls of the WLs 130 are considered as interfaces wherein the protrusion 140 contacts the WLs 130. It will be understood that a distance from a vertex of the protrusion 140 to a bottom edge of the protrusion 140 is the first height difference, and the larger the first height difference, the larger area of the protrusion 140 and the larger contact area with the WLs 130.

In some embodiments, orthographic projection, of a side of each of the WLs 130 contacting the sides of the active regions 100, on a surface of the substrate 10 is of a stepped shape. The first height difference is controlled based on the number of steps and the height of the step. In some embodiments, the orthographic projection, of the side of each of the WLs 130 contacting the sides of the active regions 100, on the surface of the substrate 10 may also be of an arc shape, that is, the protrusion 140 has arc-shaped orthographic projection on the surface of the substrate 10. The arc-shaped protrusion 140 can reduce the point discharge of the protrusion 140 and malfunction of the semiconductor structure.

In some embodiments, the WLs 130 each may be of a laminated structure including a semiconductor conductive layer and a metal layer. The semiconductor conductive layer may be made of polycrystalline silicon, and the metal layer may be made of tungsten. In other embodiments, the WLs 130 each may also be of a single structure only including a semiconductor conductive layer or a metal layer.

The semiconductor structure may further include: a protective layer 150 on top surfaces of the WLs 130. A side of the protective layer 150 contacts sides of the active regions 100 and sides of the isolation structures 110. In a direction perpendicular to a surface of the substrate 10, a length of the protrusion 140 is greater than a length of each of the WLs 130.

It will be understood that, in the direction perpendicular to the surface of the substrate 10, the protrusion 140 contacts a sidewall of each of the WLs 130, and the protrusion 140 further contacts a sidewall of the protective layer 150 by at least a certain thickness. The protective layer 150 is configured to protect the WLs 130 to ensure normal work of the semiconductor structure.

In an embodiment, in the direction perpendicular to the surface of the substrate 10, a length of the protrusion 140 is the same as a sum for a length of each of the WLs 130 and a length of the protective layer 150, that is, the protrusion 140 contacts the sidewall of each of the WLs 130, and the protrusion 140 further contacts the sidewall of the whole protective layer 150. Accordingly, orthographic projection of a sidewall of the protective layer 150, contacting the sides of the active regions 100, on the surface of the substrate 10 may also be of a stepped shape.

In other embodiments, the protrusion 140 may only contact the sidewall of each of the WLs 130, that is, in the direction perpendicular to the surface of the substrate 10, a length of the protrusion 140 is less than or equal to a length of each of the WLs 130, and orthographic projection, of each of the active regions 100 and isolation structures 110 contacting the protective layer 150, on the surface of the substrate 10 is of a straight line. More specifically, in the direction perpendicular to the surface of the substrate 10, if the protrusion 140 is shorter than the WL 130, a part of the WL 130 contacts the protrusion 140, and orthographic projection of a contact surface between a remaining part of the WL 130 and each of the active regions 100 and the isolation structures 110 on the surface of the substrate 10 is of a straight line.

In some embodiments, the protective layer 150 may be made of silicon oxide or silicon nitride or the like.

It is to be noted that in the direction perpendicular to the surface of the substrate 10, each step on the side of the protective layer 150 contacting the sides of the active regions 100 has the small length and width, so contact surfaces between the active regions 100 and the protective layer 150 in FIG. 1 appear arc-shaped.

In some embodiments, the stepped shape may be a symmetric pattern, and may be symmetric with respect to a plane perpendicular to the second direction Y. In some embodiments, a ratio of a height of the stepped shape in a direction perpendicular to the first direction X to a width of each of the active regions 100 between adjacent isolation structures 110 in a direction parallel to the first direction X is ½-1. When the ratio of the height of the stepped shape to the width of each of the active regions 100 between adjacent isolation structures 110 is less than ½, the contact area between the active regions 100 and the WLs 130 is small, with the undesirable effect.

In some embodiments, top surfaces of the isolation structures 110 exposed by the WLs 130 may further be lower than top surfaces of the active regions 100 exposed by the WLs 130. Besides the top surfaces of the WLs 130, the protective layer 150 may further be located on the top surfaces of the isolation structures 110 exposed by the WLs 130. In some embodiments, the first height difference is also formed between active regions 100 and isolation structures 110 exposed by bottom surfaces of the WL trenches 120, and orthographic projection of the active regions 100 within a plane in the first direction X is also of a stepped shape. In some embodiments, the projection of the active regions 100 exposed by the bottom surfaces of the WL trenches 120 within the plane in the first direction X and the projection of the active regions 100 exposed by the sidewalls of the WL trenches 120 on the surface of the substrate 10 may be of a same type.

By forming the stepped active regions 100 on the bottom surfaces of the WL trenches 120, the contact area between the bottom surfaces of the WLs 130 and the active regions 100 is increased, and the WLs 130 better control the conductivity of the channels in the active regions 100.

The semiconductor structure provided by the embodiment of the present application includes WL trenches 120 penetrating through active regions 100 and isolation structures 110 along a first direction X, and WLs 130 filling the WL trenches 120. A first height difference is formed in a second direction Y between the active regions 100 and the isolation structures 110, and the second direction Y is parallel to a substrate 10 and perpendicular to the first direction X. By providing the semiconductor structure having the first height difference in the second direction Y between the active regions 100 and the isolation structures 110 in the WL trenches 120, the present application increases the contact area between the active regions 100 and the WLs 130 and the flow area of the current, thereby helping the WLs 130 better control the conductivity of channels in the active regions 100, and improving the working efficiency of the semiconductor structure.

Figure 5:
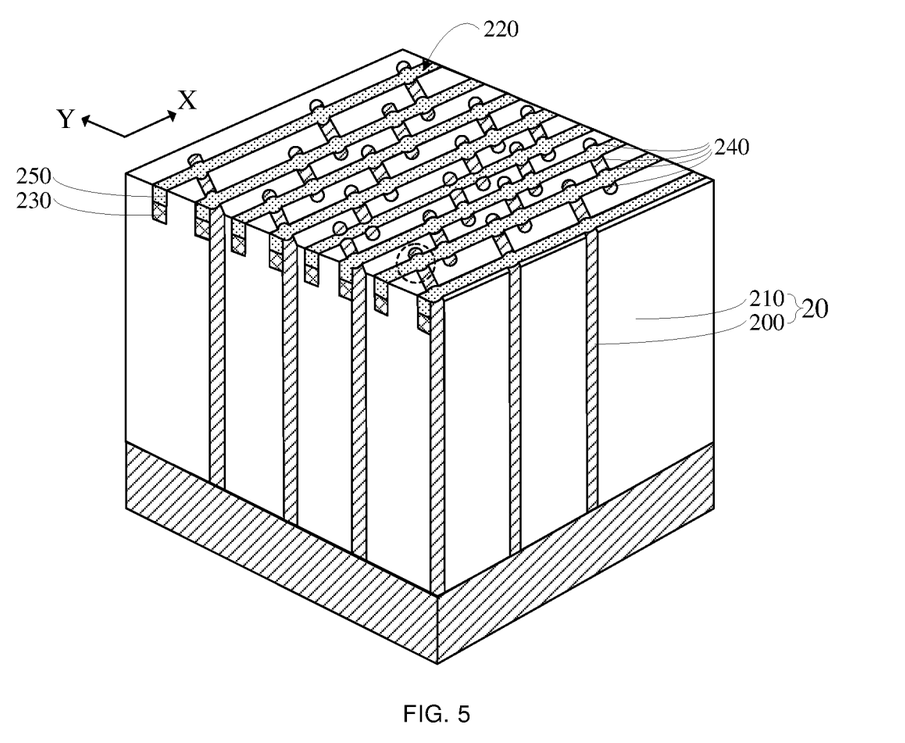
FIG. 5 illustrates a semiconductor structure according to another embodiment of the present application.
Figure 6:
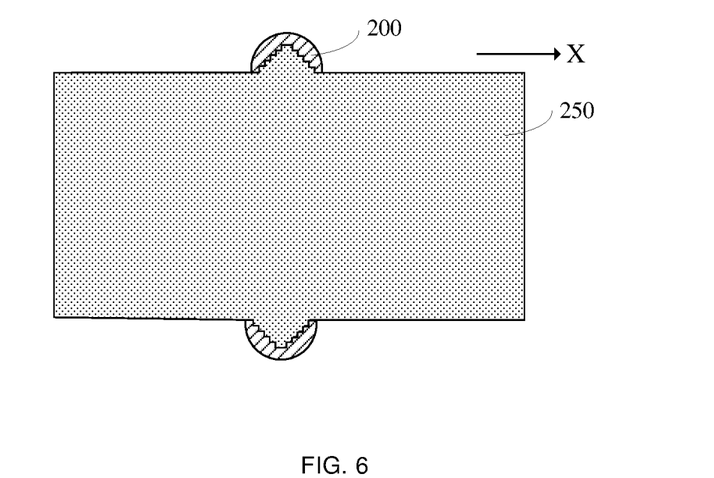
FIG. 6 is a partially enlarged schematic view of a semiconductor structure according to another embodiment of the present application.

Another embodiment of the present application further provides a semiconductor structure. The semiconductor structure is approximately the same as that described in the above embodiment, with the following main differences: Portions of the active regions contacting the WLs each are referred to as a recess, and a width of the WL which contacting the recess is greater than a width of the WL which contacting each of the isolation structures.

FIG. 5 is a schematic structural view of a semiconductor structure according to another embodiment of the present application. FIG. 6 is a partially enlarged schematic view along a dotted line in FIG. 5.

Referring to FIG. 5 and FIG. 6, the semiconductor structure includes: a substrate 20, including active regions 200 arranged at intervals and isolation structures 210 located between the active regions 200; WL trenches 220, penetrating through the active regions 200 and the isolation structures 210 along a first direction X; and WLs 230, located in the WL trenches 220. On a section parallel to a second direction Y, a first height difference is formed between the active regions 200 and the isolation structures 210, and the second direction Y is parallel to the substrate 20 and perpendicular to the first direction X.

In some embodiments, the active regions 200 each include a recess 240. A side of the recess 240 contacts each of the WLs 230. Along the first direction X, the width of the WL 230 which contacting the recess 240 is greater than the width of the WL 230 which contacting each of the isolation structures 210. The recess 240 extends toward a direction away from each of the WLs 230. By forming the active regions 200 each having the recess 240, the contact area between the active regions 200 and the WLs 230 is increased, and the WLs 230 better control the conductivity of channels in the active regions 200.

In some embodiments, orthographic projection, of a side of each of the WLs 230 contacting sides of the active regions 200, on a surface of the substrate 20 may be of a stepped shape, namely orthographic projection of the recess 240 on the surface of the substrate 20 may be of a stepped shape. In some embodiments, if the number of steps in the stepped shape is sufficient, the orthographic projection of the recess 240 on the surface of the substrate 20 is of an arc shape.

Specifically, the stepped shape may be a symmetric pattern, and may be symmetric with respect to a plane perpendicular to the second direction Y. In addition, a ratio of a height of the stepped shape in a direction perpendicular to the first direction X to a width of each of the active regions 200 between adjacent isolation structures 210 in a direction parallel to the first direction X is ½-1.

It is to be noted that the contact area between the active regions 200 and the WLs 230 is increased regardless of the stepped recess 240 or the arc-shaped recess 240, thereby helping the WLs 230 better control the conductivity of channels in the active regions 200, and improving the working efficiency of the semiconductor structure.

In some embodiments, the semiconductor structure further includes: a protective layer 250 on top surfaces of the WLs 230. A side of the protective layer 250 contacts sides of the active regions 200 and a side of the protective layer 250 contacts sides of the isolation structures 210. In a direction perpendicular to a surface of the substrate 20, a length of the recess 240 is greater than a length of the each of the WLs 230.

It will be understood that in the direction perpendicular to the surface of the substrate 20, the length of the recess 240 may be greater than the length of the each of the WLs 230, namely the recess 240 further contacts a sidewall of the protective layer 250 besides a sidewall of each of the WLs 230. In this way, orthographic projection of a side of the protective layer 250 contacting the sides of the active regions 200 on the surface of the substrate 20 is also of the stepped shape. The active regions 200 each are provided with the recess 240, and the recess 240 contacts each of the WLs 230, so the semiconductor structure provided by the embodiment increases the contact area between the active regions 200 and the WLs 230 and the flow area of the current through the recess 240, thereby helping the WLs 230 better control the turn-on speed of channels in the active regions 200, and improving the working efficiency of the semiconductor structure.

An embodiment of the present application further provides a method of manufacturing a semiconductor structure, which may be used to manufacture the semiconductor structure in the above embodiment. The method of manufacturing a semiconductor structure provided by the embodiment of the present application will be described below with reference to the accompanying drawings. Contents the same as or corresponding to those mentioned in the semiconductor structure may be referred to the corresponding descriptions and will not be repeated herein.

FIG. 7 to FIG. 15 are schematic structural diagrams corresponding to various steps in a method of manufacturing a semiconductor structure according to an embodiment of the present application.

Figure 7:
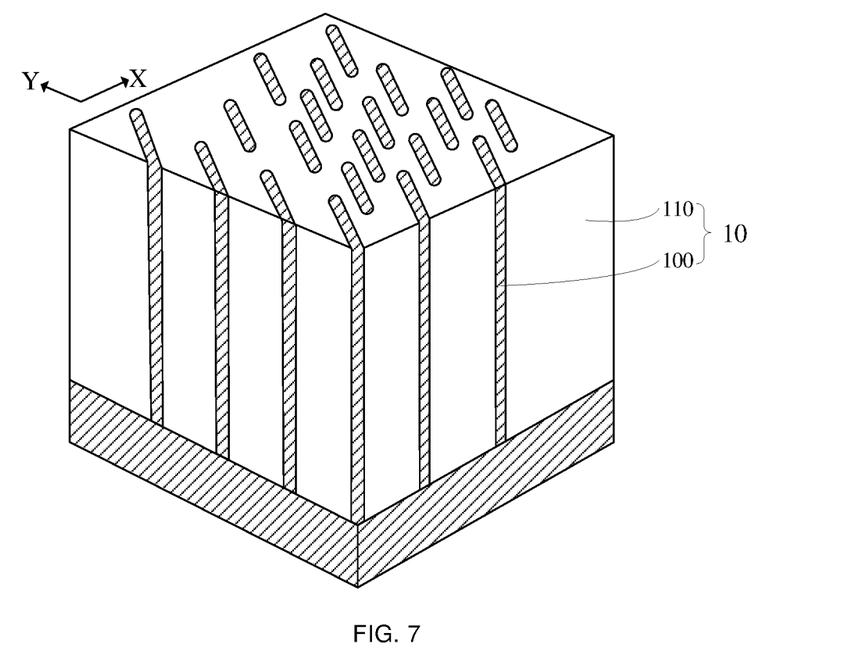
FIG. 7 is a schematic structural view of forming active regions in the substrate in a method of manufacturing a semiconductor structure according to an embodiment of the present application.

Referring to FIG. 7, a substrate 10 is provided. The substrate 10 includes active regions 100 arranged at intervals and isolation structures 110 located between the active regions 100.

Figure 8:
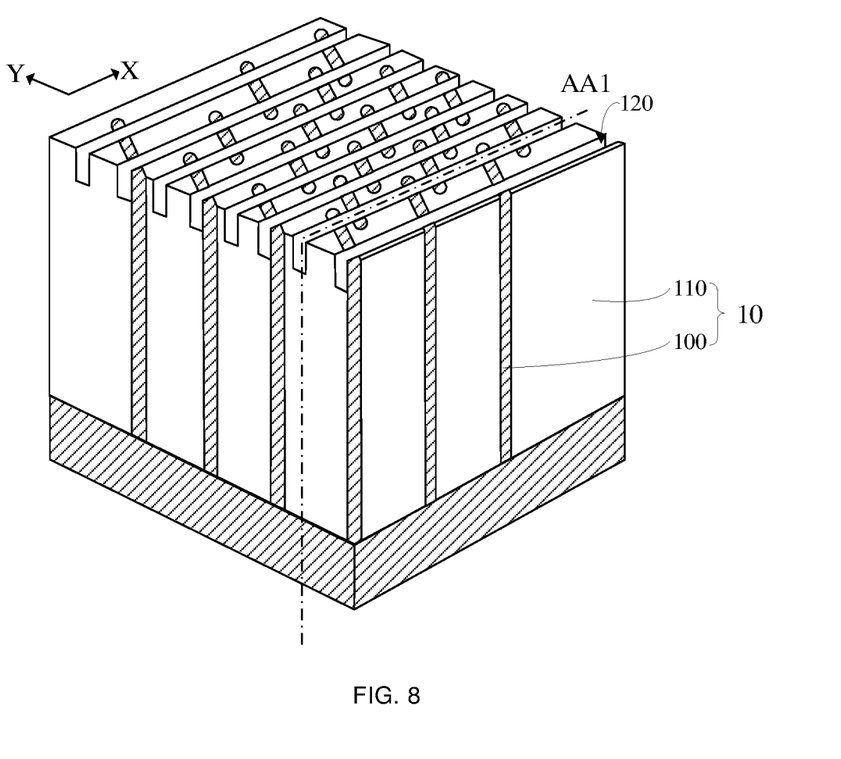
FIG. 8 is a schematic structural view of forming WL trenches in a method of manufacturing a semiconductor structure according to an embodiment of the present application.
Figure 9:
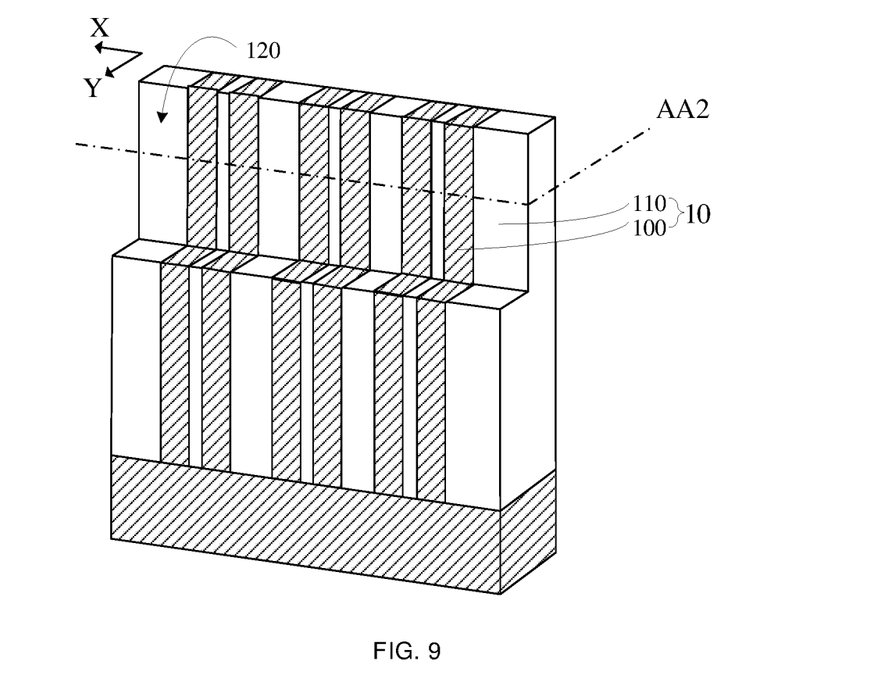
FIG. 9 is a schematic sectional view along a dotted line AA1 in FIG. 8.

Referring to FIG. 8 and FIG. 9, FIG. 9 is a sectional view along a dotted line AA1 in FIG. 8. The active regions 100 and the isolation structures 110 are patterned to form WL trenches 120. The WL trenches 120 extend along a first direction X. Sidewalls of the WL trenches 120 expose the active regions 100 and the isolation structures 110.

In some embodiments, the WL trenches 120 are formed with dry etching. In some embodiments, there are different etching rates for the active regions 100 and the isolation structures 110 in the dry etching, such that the WL trenches 120 each have an uneven bottom surface. For example, if an etching rate for the active regions 100 is greater than that for the isolation structures 110 in the etching, top surfaces of isolation structures 110 are higher than top surfaces of active regions 100 on bottom surfaces of the WL trenches 120. If an etching rate for the active regions 100 is less than that for the isolation structures 110 in the etching, the top surfaces of the isolation structures 110 are lower than the top surfaces of the active regions 100 on the bottom surfaces of the WL trenches 120.

In some embodiments, the top surfaces of the active regions 100 may also be as high as the top surfaces of the isolation structures 110 on the bottom surfaces of the WL trenches 120, and sides of the active regions 100 and sides of the isolation structures 110 exposed by the sidewalls of the WL trenches 120 may be flush.

Referring to FIG. 10 to FIG. 15, corner rounding is performed at least once on the active regions 100 and isolation structures 110 exposed by the sidewalls of the WL trenches 120 (referring to FIG. 9), such that a first height difference is formed in a second direction Y between the active regions 100 and isolation structures 110 exposed by the sidewalls of the WL trenches 120 (referring to FIG. 9).

Figure 10:
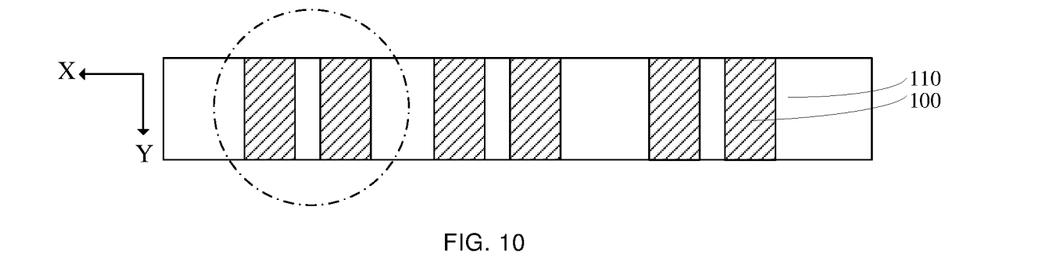
FIG. 10 is a schematic sectional view along a dotted line AA2 in FIG. 9.
Figure 11:
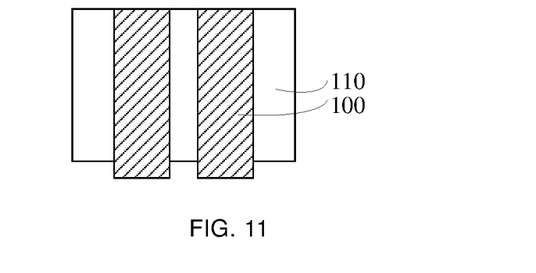
FIG. 11 is a partially enlarged schematic view of semiconductor structure at the circular dotted line of FIG. 10 during a stage of method of manufacturing a semiconductor structure according to an embodiment of the present application.

The corner rounding will be described below in detail with reference to the drawings. Referring to FIG. 10 and FIG. 11, FIG. 10 is a sectional view along an AA2 direction in FIG. 9, and FIG. 11 is a partially enlarged schematic view along a circular dotted line in FIG. 10. The isolation structures 110 exposed by the sidewalls of the WL trenches 120 (referring to FIG. 9) are etched, such that the active regions 100 are partially exposed by the isolation structures 110 in the second direction Y.

In some embodiments, wet etching may be used to etch the isolation structures 110, namely the isolation structures 110 exposed by the sidewalls of the WL trenches 120 (referring to FIG. 9).

When the isolation structures 110 are made of silicon oxide, a hydrofluoric acid solution having a molar concentration of 40-60%, such as a hydrofluoric acid solution having a molar concentration of 49%, serves as an etching reagent in the wet etching.

In some embodiments, the wet etching lasts for 10-30 s, such as 15 s, 17 s or 20 s. It will be understood that the etching depth may be controlled by adjusting the mole of the solvent and the etching time in the wet etching.

Figure 12:
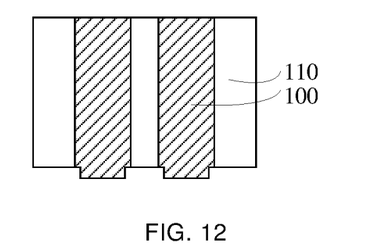
FIG. 12 is a partially enlarged schematic view of semiconductor structure at the circular dotted line of FIG. 10 during a further stage of method of manufacturing a semiconductor structure according to an embodiment of the present application.

Referring to FIG. 12, exposed active regions 100 are etched. In the exposed active regions 100, an etching rate for corner regions is greater than that for regions out of the corner regions.

In some embodiments, the wet etching is used to etch the exposed active regions 100. The wet etching includes that the active regions 100 are etched for 10-30 s with a nitric acid solution having a molar concentration of 20-50%.

In some embodiments, the active regions 100 are etched by a thickness of 1-3 nm in a direction parallel to the second direction. The smaller the etched thickness of the active regions 100, the greater the corresponding number of times for performing the corner rounding. If the etched thickness of the active regions 100 is large, the active regions 100 will be removed excessively to affect the ion carrying capability of the active regions 100.

It will be understood that the etched thickness of the active regions 100 may be controlled by adjusting the molar concentration of the etching reagent and the etching time.

Figure 13:
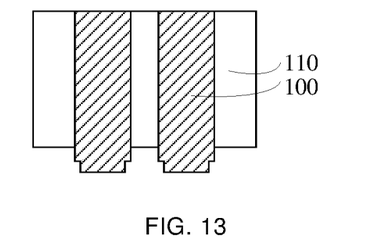
FIG. 13 is a partially enlarged schematic view of semiconductor structure at the circular dotted line of FIG. 10 during a still further stage of method of manufacturing a semiconductor structure according to an embodiment of the present application.
Figure 14:
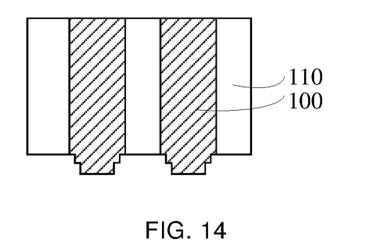
FIG. 14 is a partially enlarged schematic view of semiconductor structure at the circular dotted line of FIG. 10 during a yet further stage of method of manufacturing a semiconductor structure according to an embodiment of the present application.

Referring to FIG. 13 and FIG. 14, next corner rounding is performed.

Specifically, referring to FIG. 13, isolation structures 110 exposed by a sidewall of at least one of the WL trenches 120 (referring to FIG. 9) are etched.

Referring to FIG. 14, the wet etching is used to etch the active regions 100 exposed by the sidewalls of the WL trenches 120 (referring to FIG. 9).

It will be understood that whenever the corner rounding is performed again, there is one step more formed on orthographic projection of each of the active regions 100 exposed by the WL trenches 120 (referring to FIG. 9) on the surface of the substrate 10, and a height difference from the top surfaces of the active regions 100 exposed by the sidewalls of the WL trenches 120 (referring to FIG. 9) to the isolation structures 110 exposed by the sidewalls of the WL trenches 120 (referring to FIG. 9) is increased. By controlling the number of times for performing the corner rounding, the first height difference is formed between the active regions 100 and isolation structures 110 exposed by the sidewalls of the WL trenches 120 (referring to FIG. 9).

Figure 15:
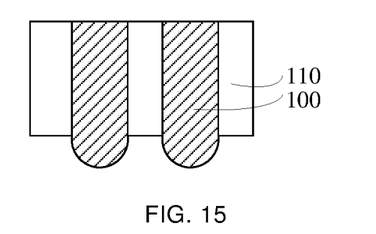
FIG. 15 is a partially enlarged schematic view of semiconductor structure at the circular dotted line of FIG. 10 after completing corner rounding stage of method of manufacturing a semiconductor structure according to an embodiment of the present application.

Referring to FIG. 15, upon completion of the corner rounding, the first height difference is formed between the active regions 100 and isolation structures 110 exposed by the sidewalls of the WL trenches 120 (referring to FIG. 9).

The corner rounding may be performed for 2-10 times. It will be understood that the number of times for performing the corner rounding may be adjusted according to the required first height difference.

After the corner rounding, the active regions 100 each have arc-shaped orthographic projection on the surface of the substrate 10 (referring to FIG. 1). It will be understood that, as the step formed by each corner rounding is small, the active regions 100 after repeated corner rounding each are of an arc shape. Actually, the arc shape is the step shape composed of a plurality of steps.

Referring to FIG. 1, upon completion of the corner rounding, WLs 130 filling the WL trenches 120 are formed.

In some embodiments, when the isolation structures 110 exposed by the sidewalls of the WL trenches 120 are etched, top surfaces of the isolation structures 110 may further be etched. Top surfaces of remaining isolation structures 110 enclose recessed regions with adjacent active regions 100. Accordingly, after the WLs 130 are formed, the method of manufacturing a semiconductor structure may further include: A protective layer 150 is formed. The protective layer 150 is located on surfaces of the WLs 130 and fills the WL trenches 120. The protective layer 150 further fills the recessed regions.

According to the method of manufacturing a semiconductor structure provided by the embodiment of the present application, after the active regions 100 and the isolation structures 110 on the substrate 10 are patterned to form the WL trenches 120 extending along the first direction X, the corner rounding is performed at least once on the active regions 100 and isolation structures 110 exposed by the sidewalls of the WL trenches 120 to form the first height difference in the second direction Y between the active regions 100 and isolation structures 110 exposed by the sidewalls of the WL trenches 120. By forming the protrusion 140 on each of the active regions 100, the contact area between the active regions 100 and the WLs 130 and the flow area of the current are increased, thereby helping the WLs 130 better control turn-on speeds of channels in the active regions 100, and improving the working efficiency of the semiconductor structure.

Another embodiment of the present application further provides a method of manufacturing a semiconductor structure, which may be used to manufacture the semiconductor structure in the above embodiment. It is to be noted that the manufacturing method in the embodiment of the present application differs from the manufacturing method in the above embodiment mainly in: The active regions on the sidewalls of the WL trenches have different shapes. Contents same as or corresponding to the above embodiment may refer to the corresponding descriptions in the above embodiment and will not be repeated hereinafter.

Figure 16:
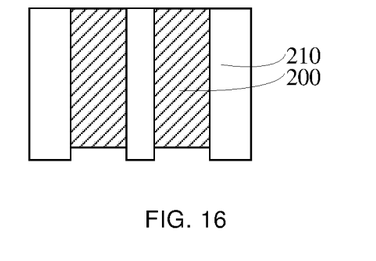
FIG. 16 is a partially enlarged schematic view of semiconductor structure at the circular dotted line of FIG. 10 during a stage of method of manufacturing a semiconductor structure according to another embodiment of the present application.

Referring to FIG. 16, FIG. 16 is a partially enlarged view along a circular dotted line in FIG. 10. The active regions 200 exposed by the sidewalls of the WL trenches 220 (referring to FIG. 5) are etched.

Figure 17:
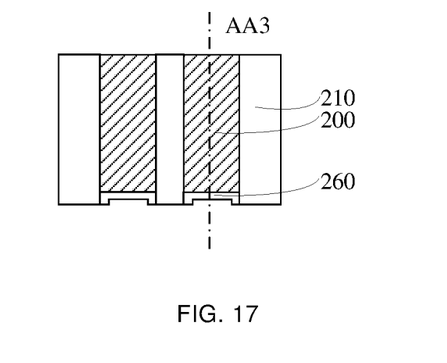
FIG. 17 is a partially enlarged schematic view of semiconductor structure at the circular dotted line of FIG. 10 during a further stage of method of manufacturing a semiconductor structure according to another embodiment of the present application.

Referring to FIG. 17, an oxide layer 260 is formed on top surfaces of the active regions 200 exposed by the sidewalls of the WL trenches 220 (referring to FIG. 5) and sidewalls of isolation structures 210 exposed after the active regions 200 are etched.

In some embodiments, atomic layer deposition (ALD) is used to form the oxide layer 260 on the top surfaces of the active regions 200 exposed by the sidewalls of the WL trenches 220 (referring to FIG. 5) and the sidewalls of the isolation structures 210. The ALD is helpful to form the oxide layer 260 with good uniformity and compactness and better control the thickness of the oxide layer 260.

In some embodiments, the oxide layer 260 may be made of silicon oxide.

Figure 18:
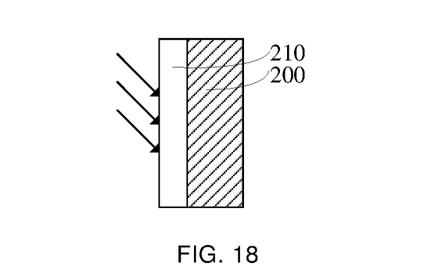
FIG. 18 is a schematic sectional view along a dotted line AA3 in FIG. 17.
Figure 19:
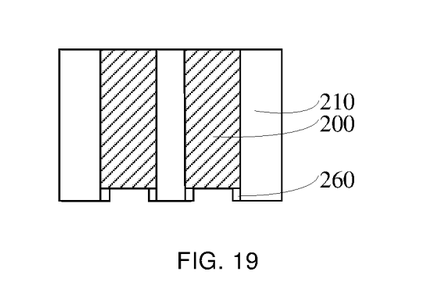
FIG. 19 is a partially enlarged schematic view of semiconductor structure at the circular dotted line of FIG. 10 during a still further another stage of method of manufacturing a semiconductor structure according to another embodiment of the present application.

Referring to FIG. 18 and FIG. 19, FIG. 18 is a sectional view along an AA3 direction in FIG. 17. Dry etching is used to etch the oxide layer 260.

It will be understood that tilting angles of ions in the dry etching are usually increased to completely etch the oxide layer 260 on bottom surfaces of the WL trenches 220 (referring to FIG. 5). By adjusting incident angles of the ions, the oxide layer 260 on the surfaces of the active regions 200 exposed by the sidewalls of the WL trenches 220 (referring to FIG. 5) is removed completely.

In some embodiments, the oxide layer 260 on the sidewalls of the isolation structures 210 may further be retained to lay the foundation for subsequent etching of the active regions 200.

Figure 20:
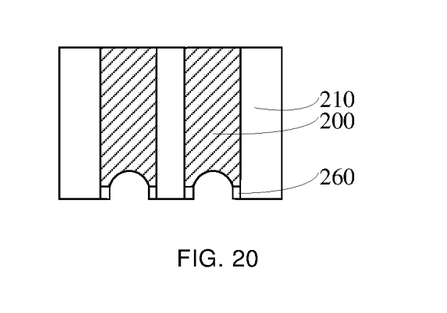
FIG. 20 is a partially enlarged schematic view of semiconductor structure at the circular dotted line of FIG. 10 during a yet further stage of method of manufacturing a semiconductor structure according to another embodiment of the present application.

Referring to FIG. 20, wet etching is used to etch the active regions 200 exposed by the sidewalls of the WL trenches 220 (referring to FIG. 5).

Because of isotropy of the wet etching, etched active regions 200 each have arc-shaped projection on the surface of the substrate 20.

In some embodiments, the active regions 200 are made of silicon, and a solution mixed by nitric acid having a molar concentration of 20-50% and water may serve as a reagent in the wet etching to etch the active regions 200.

Figure 21:
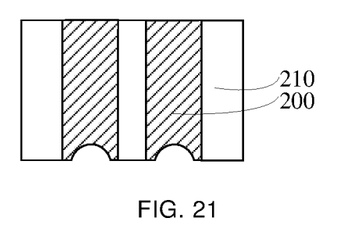
FIG. 21 is a partially enlarged schematic view of semiconductor structure at the circular dotted line of FIG. 10 during another stage of method of manufacturing a semiconductor structure according to another embodiment of the present application.

Referring to FIG. 21, the oxide layer 260 (referring to FIG. 19) and at least one of the isolation structures 210 exposed by the sidewalls of the WL trenches 220 (referring to FIG. 5) are removed to expose surfaces of the active regions 200.

In some embodiments, both the oxide layer 260 (referring to FIG. 19) and the isolation structures 210 are made of silicon oxide. While the wet etching is used to etch the oxide layer 260 (referring to FIG. 19), at least one of the isolation structures 210 exposed by the sidewalls of the WL trenches 220 (referring to FIG. 5) is removed synchronously.

Figure 22:
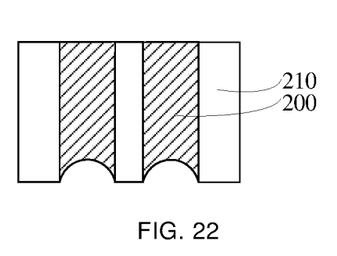
FIG. 22 is a partially enlarged schematic view of semiconductor structure at the circular dotted line of FIG. 10 after completing corner rounding stage of method of manufacturing a semiconductor structure according to another embodiment of the present application.

Referring to FIG. 22, the wet etching is used to etch the active regions 200 exposed by the sidewalls of the WL trenches 220 (referring to FIG. 5) to expand radii of curvature of etched portions of the active regions 200, thereby increasing the contact area between the active regions 200 and the subsequently formed WLs 230.

In some embodiments, the oxide layer may also not be formed, but the active regions are directly etched. The contact area between the active regions and the WLs in the scheme in which the oxide layer is not formed, but the active regions are directly etched is less than that between the active regions and the WLs in the scheme in which the oxide layer is formed and the active regions are etched.

It will be understood that a recess 240 may be formed in each of the active regions 200 by repeating the above steps. The subsequently formed WLs 230 each contact the side of the recess 240.

The manufacturing method further includes: WLs 230 filling the WL trenches 220 are formed, a side of the recess 240 contacting each of the WLs 230. A protective layer 250 is formed, the protective layer 250 covering surfaces of the WLs 230 and filling the WL trenches 220. For the method and step for forming the WLs 230 and the protective layer 250, refer to the detailed descriptions in the above embodiment.

In the embodiment, the active regions 200 each having the recess 240 are formed, and the recess 240 contacts each of the WLs 230, such that the contact area between the active regions 200 and the WLs 230 and the flow area of the current are increased, thereby helping the WLs 230 better control the turn-on speed of channels in the active regions 200, and improving the working efficiency of the semiconductor structure.

Those of ordinary skill in the art should understand that the above implementations are specific embodiments for implementing the present application. In practical applications, various changes may be made to the above implementations in terms of form and details without departing from the spirit and scope of the present application.

Those skilled in the art may make changes and modifications to the implementations without departing from the spirit and scope of the present application. Therefore, the protection scope of the present application should be subject to the scope defined by the claims.

The invention claimed is:

1. A semiconductor structure, comprising:
a substrate, comprising active regions arranged at intervals and an isolation structure located between the active regions;
a word line trench, penetrating through the active region and the isolation structure along a first direction;
a word line, located in the word line trench, wherein a top surface of the isolation structure exposed by the word line is lower than a top surface of the active region exposed by the word line, and
a protective layer, located on a top surface of the word line and on the top surface of the isolation structures exposed by the word line;
wherein on a section parallel to a second direction, a first height difference is formed between the active region and the isolation structure; and the second direction is parallel to the substrate and perpendicular to the first direction.

2. The semiconductor structure according to claim 1, wherein the active region comprises a protrusion, a side of the protrusion contacts the word line, and along the second direction, a width of the word line which contacting the protrusion is smaller than the width of the word line which contacting the isolation structure.

3. The semiconductor structure according to claim 2, wherein a side of the protective layer contacts a side of the active region and a side of the isolation structure, and in a direction perpendicular to a surface of the substrate, a length of the protrusion is greater than a length of the word line.

4. The semiconductor structure according to claim 2, wherein
an orthographic projection, of a side of the word line contacting the side of the active region, on a surface of the substrate is of a stepped shape.

5. The semiconductor structure according to claim 4, wherein
the stepped shape is a symmetric pattern, and is symmetric with respect to a plane perpendicular to the second direction.

6. The semiconductor structure according to claim 4, wherein
a ratio of a height of the stepped shape in a direction perpendicular to the first direction to a width of the active region between adjacent isolation structures in a direction parallel to the first direction is ½-1.

7. The semiconductor structure according to claim 1, wherein
the active region comprises a recess, a side of the recess contacts the word line, and along the first direction, a width of the word line which contacting the recess is greater than a width of the word line which contacting the isolation structure.

8. The semiconductor structure according to claim 7, wherein a side of the protective layer contacts a side of the active region and a side of the protective layer contacts a side of the isolation structure, and in a direction perpendicular to a surface of the substrate, a length of the recess is greater than a length of the word line.

9. The semiconductor structure according to claim 7, wherein
an orthographic projection, of a side of the word line contacting the side of the active region, on a surface of the substrate is of a stepped shape.

10. A method of manufacturing a semiconductor structure, comprising:
providing a substrate, the substrate comprising active regions arranged at intervals and an isolation structure located between the active regions;
patterning the active region and the isolation structure, and forming a word line trench, the word line trench extending along a first direction, and a sidewall of the word line trench exposing the active region and the isolation structure;
performing corner rounding at least once on the active region and the isolation structure exposed by the sidewall of the word line trench, such that a first height difference is formed in a second direction between the active region and the isolation structure exposed by the sidewall of the word line trench, the second direction being parallel to the substrate and perpendicular to the first direction; and
forming, upon completion of the corner rounding, a word line filling the word line trench.

11. The method of manufacturing the semiconductor structure according to claim 10, wherein
the corner rounding comprises:
etching the isolation structure exposed by the sidewall of the word line trench, such that the isolation structure exposes the active region in the second direction; and
etching the exposed active region, an etching rate for corner region of the exposed active region being greater than an etching rate for region out of the corner region.

12. The method of manufacturing the semiconductor structure according to claim 11, wherein
the active region is etched by a thickness of 1 nm-3 nm in a direction parallel to the second direction.

13. The method of manufacturing the semiconductor structure according to claim 11, wherein
when the isolation structure exposed by the sidewall of the word line trench is etched, a top surface of the isolation structure is further etched, remaining the top surface of the isolation structure enclosing recessed region with adjacent active regions;
and after the word line is formed, the method of manufacturing the semiconductor structure further comprises: forming a protective layer, the protective layer being located on a surface of the word line, and filling the word line trench as well as the recessed region.

14. The method of manufacturing the semiconductor structure according to claim 11, wherein
a wet etching is used to etch the exposed active region, and process parameter of the wet etching comprises: an etching time of the active region for 10 s-30 s with a nitric acid solution having a molar concentration of 20%-50%.

15. The method of manufacturing the semiconductor structure according to claim 10, wherein
the corner rounding is performed for 2-10 times.

16. The method of manufacturing the semiconductor structure according to claim 10, further comprising:
forming a protective layer, wherein a top surface of the isolation structure exposed by the word line is lower than a top surface of the active region exposed by the word line, and the protective layer located on a top surface of the word line and on the top surface of the isolation structures exposed by the word line.

17. The method of manufacturing the semiconductor structure according to claim 10, the corner rounding comprises:
forming an oxide layer on top surfaces of the active regions exposed by the sidewalls of the word line trenches and sidewalls of isolation structures exposed after the active regions are etched;
removing the oxide layer on the surfaces of the active regions exposed by the sidewalls of the word line trenches by dry etching and increasing tilting angles of ions in the dry etching;
etching the active regions exposed by the sidewalls of the word line trenches by wet etching;
removing the oxide layer and at least one of the isolation structures exposed by the sidewalls of the WL trenches to expose surfaces of the active regions;
etching the active regions exposed by the sidewalls of the word line trenches by wet etching to expand radii of curvature of etched portions of the active regions.

18. A semiconductor structure, comprising:
a substrate, comprising active regions arranged at intervals and an isolation structure located between the active regions;
a word line trench, penetrating through the active region and the isolation structure along a first direction; and
a word line, located in the word line trench,
wherein on a section parallel to a second direction, a first height difference is formed between the active region and the isolation structure; and the second direction is parallel to the substrate and perpendicular to the first direction, and
wherein the active region comprises a recess, a side of the recess contacts the word line, and along the first direction, a width of the word line which contacting the recess is greater than a width of the word line which contacting the isolation structure.

19. The semiconductor structure according to claim 18, further comprising:
a protective layer on a top surface of the word line, wherein a side of the protective layer contacts a side of the active region and a side of the protective layer contacts a side of the isolation structure, and in a direction perpendicular to a surface of the substrate, a length of the recess is greater than a length of the word line.

20. The semiconductor structure according to claim 18, wherein
an orthographic projection, of a side of the word line contacting the side of the active region, on a surface of the substrate is of a stepped shape.

* * * * *